United States Patent [19]

Jason

[11] Patent Number: 4,525,683

[45] Date of Patent: Jun. 25, 1985

[54] CURRENT MIRROR HAVING BASE CURRENT ERROR CANCELLATION CIRCUIT

[75] Inventor: Barry L. Jason, Bedford, Tex.

[73] Assignee: Motorola, Inc., Schaumburg, Ill.

[21] Appl. No.: 558,254

[22] Filed: Dec. 5, 1983

[51] Int. Cl.³ .............................................. H03F 3/04
[52] U.S. Cl. .................................................... 330/288
[58] Field of Search ................ 330/257, 288; 323/315, 323/316

[56] References Cited

U.S. PATENT DOCUMENTS

| | | |
|---|---|---|
| 3,855,541 | 12/1974 | Leidich . |
| 3,886,466 | 5/1975 | Wheatly, Jr. . |
| 3,962,592 | 6/1976 | Thommen et al. . |
| 4,166,971 | 9/1979 | Schneider . |
| 4,217,539 | 8/1980 | Okada . |
| 4,238,738 | 12/1980 | Komori .......................... 330/288 X |
| 4,278,946 | 7/1981 | Kaplan ................................ 330/288 |
| 4,297,646 | 10/1981 | Lo Cascio ........................... 330/288 |
| 4,311,967 | 1/1982 | Schade, Jr. .......................... 330/288 |
| 4,317,082 | 2/1982 | Gross .................................. 330/288 |

OTHER PUBLICATIONS

Analog Integrated Circuit Design, Alan B. Grebene, pp. 50, 51, 56–59, 112, 113.
"A Simple Three-Terminal IC Bandgap Reference", A. Paul Brokaw, IEEE J. Solid State Circuits, vol. SC-9, pp. 388–393, Dec. 1974.
High Performance Operational Amplifier, uA741.
Basic Integrated Circuit Engineering, Hamilton and Howard, pp. 308–316.
"A Highly Stable VCO for Application in Monolithic Phase Locked Loops", Robert R. Cordell and William G. Garrett, IEEE J. Solid State Circuits, pp. 480–485, vol. SC-10, No. 6, Dec. 1975.

Primary Examiner—James B. Mullins
Assistant Examiner—Steven J. Mottola
Attorney, Agent, or Firm—F. John Motsinger; Edward M. Roney; James W. Gillman

[57] ABSTRACT

A current mirror circuit comprising a first current mirror circuit with a first error correction transistor connected between the base and collector of the first transistor of the first current mirror; a second error correction transistor connected to the first error correction transistor and a second current mirror circuit connected to an input current source and the base of the second error correction transistor. The second error correction transistor samples the signal from the collector of first error correction transistor and feeds its base current, which is almost equivalent to the base current of the first error correction transistor, to the input of the second current mirror circuit. The second current mirror circuit combines the input current source current with the base current of the second error correction transistor and generates a current which is fed to the collector of the first transistor of the first current mirror circuit. The value and polarity of the current is such as to offset the base error current of the first error correction transistor, thus improving the relationship of input current to output current of the first current mirror circuit by a factor of $\beta+1$. This improvement is especially significant when using lateral PNP transistors which typically have very low betas.

9 Claims, 5 Drawing Figures

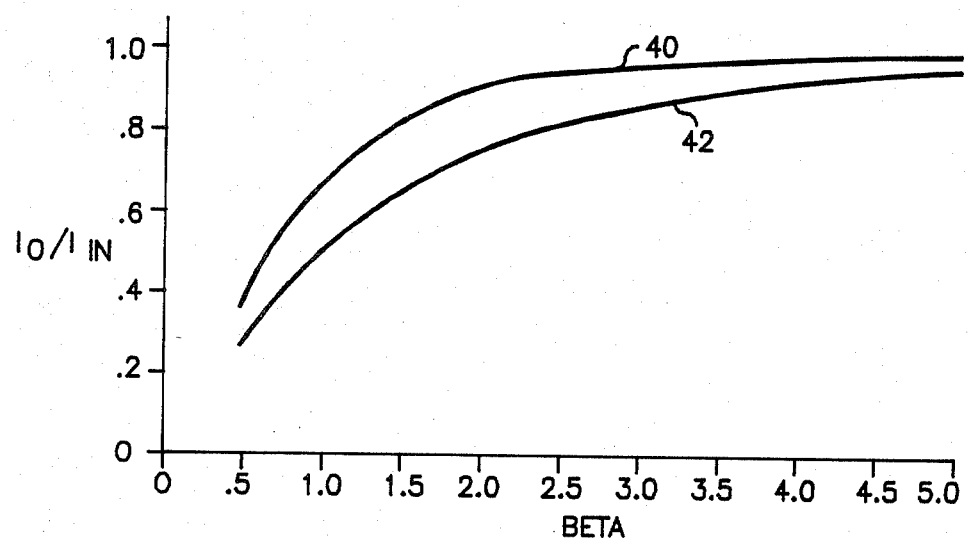
Fig. 4
Fig. 5
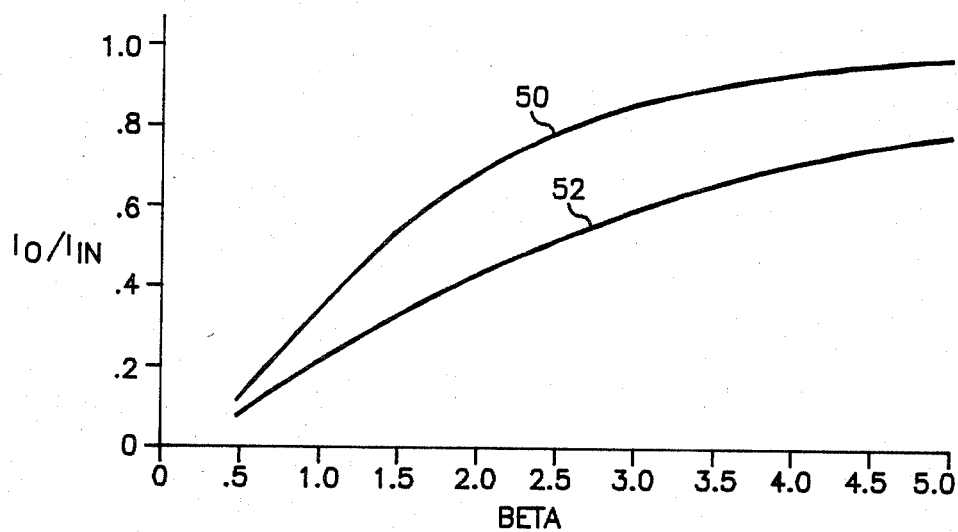

CURRENT MIRROR HAVING BASE CURRENT ERROR CANCELLATION CIRCUIT

BACKGROUND OF THE INVENTION

1. Field of the Invention

This invention relates to integrated biasing circuits and more particularly to an integrated current mirror circuit having a base current error cancellation circuit.

2. Description of the Prior Art

In the past, various biasing circuits have been designed to provide a bias current source which is suitable for integration. One such type of integrated biasing circuit has come to be known as a current mirror which when used as a current source can provide current relatively independent of transistor parameters. FIG. 1 illustrates what has come to be well known in the prior art as a basic current mirror circuit. Assuming that the transistors Q1 and Q2 are identical, operate in the active region and have the same base-emitter voltage, they must also have approximately equal collector currents. In this circuit, the bias current I is determined by the following equation:

$$I=(V_{CC}-V_D)/R \tag{1}$$

Then applying Kirchhoff's current law to the base node, the following relationship holds true:

$$I=I_C+2I_B \tag{2}$$

Further it is well known that:

$$I_C=\beta I_B \tag{3}$$

Thus, if equations (1), (2) and (3) are combined the following relationship is obtained wherein:

$$I_C=I\beta/(\beta+2)=\beta(V_{CC}-V_D)/(R(\beta+2)); \tag{4}$$

where the resultant error in output current is represented by the factor $\beta/(\beta+2)$.

Therefore in cases where beta is in the order of 50 or larger, $I_C$ is approximately equal to I.

Such a circuit is suitable for integration because it contains no capacitors and only one resistor. However, it can be seen that when beta becomes less than 50 the base current error (i.e. the reduction in input (collector) current $I_C$ due to the loading effect of the bases of the current mirror transistors Q1 and Q2) will continue to increase, making the circuit unsuitable for cases where low beta transistors are contemplated.

As mentioned above it is well known that if beta is not large or if the number of series connected transistors in the current mirror circuit is increased, the current becomes more influenced by variations of beta. This is particularly a problem with lateral PNP transistors which inherently have low values of beta. This can also be a problem with NPN transistors where precise balance of two currents is required.

In order to overcome the aforesaid problem an improved current mirror circuit was developed which adds a new transistor Q4 in the feedback path of the circuit of FIG. 1, as shown in FIG. 2 in order to make the current less dependent on beta. In the circuit of FIG. 2:

$$I=I_C+2I_B/\beta+1 \tag{5}$$

Since $I_C$ equals $\beta I_B$ then:

$$I_C=I\beta(\beta+1)/(\beta(\beta+1)+2); \tag{6}$$

where the resultant error in output current is represented by the factor $\beta(\beta+1)/(\beta(\beta+1)+2)$.

Thus, even for moderate values of beta, $I_C$ and I will be well balanced. However, for very low values of beta, the base current error may still be too high for certain desired applications.

Another application of a current mirror circuit is illustrated in the publication "A Highly Stable VCO for Application in Monolithic Phase-Locked Loops" found in Volume SC-10, No. 6 of the IEEE Journal of Solid State Circuits, published in December of 1975 and authored by Robert R. Cordell and William G. Garrett. In FIG. 3 of that reference (not shown) found on page 482, a schematic of a VCO is illustrated in which certain circuit elements have been included to minimize the errors due to transistor base current. These elements include a Darlington connection ($Q_{41}$, $Q_{42}$), current mirror "helpers" ($Q_{43}$, $Q_{49}$), and base bias current compensation ($Q_{48}$). In this circuit the base current of helper transistor $Q_{43}$ reduces the timing current delivered to the collector of $Q_{50}$. Since the collector current of $Q_{48}$ is essentially the same as that of $Q_{43}$, its base current cancels most of the error due to the base current of $Q_{43}$.

The present invention distinguishes over the prior art by providing a current mirror circuit having a base current error cancellation circuit in which the base current error is reduced by a factor of beta plus one $(\beta+1)$.

SUMMARY OF THE INVENTION

Accordingly, one object of this invention is to provide a novel current mirror circuit in which the base current error is reduced.

Another object of the present invention is to provide a novel current mirror circuit having a base current error cancellation circuit which reduces the base current error of a conventional mirror circuit by a factor of beta plus one $(\beta+1)$.

The above and other objects and advantages of the present invention are provided by a current mirror circuit which comprises a first current mirror circuit, a first error correction circuit connected to the first current mirror circuit and a second error correction circuit connected to the first error correction circuit and the input of the first current mirror circuit. The first current mirror circuit is typically used for generating a bias current in various integrated circuit applications. The first error correction circuit generates a first correction signal to improve the current relationship between the output and input of the first current mirror circuit. The second error correction circuit generates a second correction signal which is directed to the input of the first current mirror circuit to further improve the relationship between the input current and output current of the current mirror circuit.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 4 is a graph comparing the characteristics of the circuit of FIG. 3 to the characteristics of FIG. 2 when only two transistors are used in the first current mirror circuit;

FIG. 5 is a graph comparing the characteristics of the circuit of FIG. 3 to the characteristics of the circuit of FIG. 2 using eight transistors in the first current mirror circuit.

DESCRIPTION OF THE PREFERRED EMBODIMENTS

Figure 1:
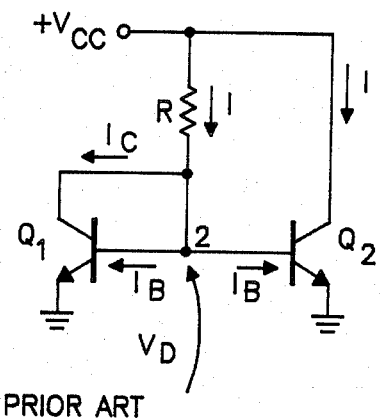
FIG. 1 is a schematic diagram of a prior art current mirror circuit.
Figure 2:
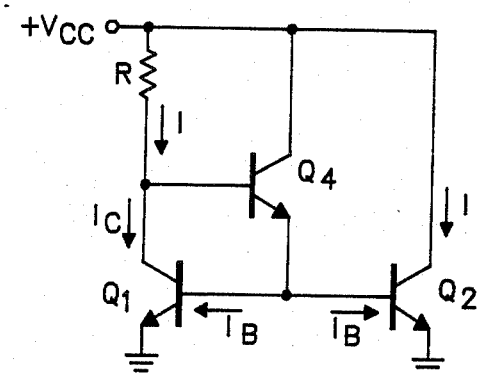
FIG. 2 is a schematic diagram of another prior art current mirror circuit.
Figure 3:
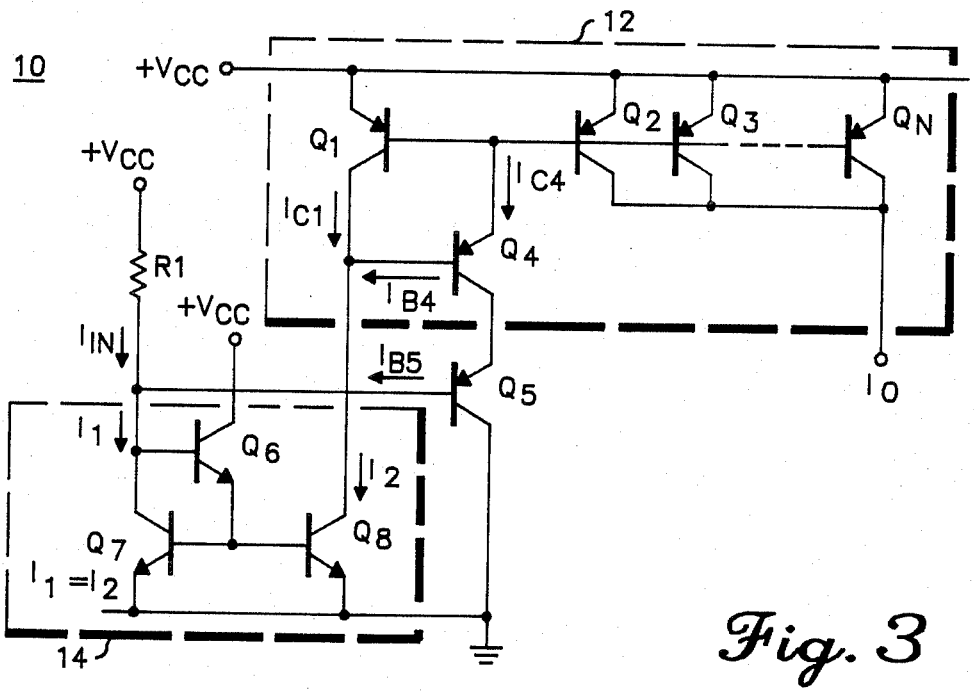
FIG. 3 is a schematic diagram of the current mirror circuit of the present invention.

Referring now to the drawings, wherein like reference numerals designate identical or corresponding parts throughout the several views, and more particularly to FIG. 3 thereof, a current mirror circuit 10 according to the present invention is illustrated. The current mirror circuit 10 includes a first current mirror circuit 12 comprised of the PNP transistors Q1 through QN having their bases commonly connected, their emitters connected to the positive voltage source $+V_{CC}$ and their collectors respectively serving as bias points for additional stages of the integrated circuit. The first current mirror circuit 12 further comprises the PNP transistor Q4 having its emitter connected to the bases of the transistors Q1 through QN and its base connected to the collector of the transistor Q1. The first current mirror circuit 12 is similar in principle to the prior art circuit illustrated in FIG. 2.

The current mirror circuit 10 of the present invention further includes a second current mirror circuit 14 and the PNP transistor Q5 having its emitter connected to the collector of the transistor Q4, its collector connected to ground and its base connected to the input of the second current mirror circuit 14. The second current mirror circuit 14 is comprised of the NPN transistors Q6, Q7 and Q8. Transistor Q6 has its collector connected to the positive power source $+V_{CC}$, its base connected to the collector of the transistor Q7 and its emitter connected to the commonly connected bases of the transistors Q7 and Q8. The emitters of the transistors Q7 and Q8 are connected to ground. The input to the second current mirror circuit 14 is also connected to one end of the resistor R1 having its other end connected to the positive power source $+V_{CC}$ which provides the input current $I_{IN}$ to the input of the second current mirror circuit 14.

In this embodiment, the current mirror circuit 10 is intended to be used in an audio power amplifier in which each of the output currents $I_0$, from the collectors of the transistor Q1 through Qn, is intended as a bias point in the amplifier. Since positive current sources are desired the use of the PNP transistors in the first current mirror circuit 12 is imperative. Thus, when the PNP transistors are formed, the geometry is such that they are lateral in structure and therefore typically have very low base to collector current gains (betas). In this configuration, especially since beta is temperature dependant, in a cold environment, the beta can get as low as 3. Thus, large base current errors would occur in the first current mirror circuit 12 without the addition of the transistor Q5 and the second current mirror circuit 14.

Still referring to FIG. 3, in operation the transistor Q4 is added to reduce the base current loading effect of the current mirror transistors Q1–QN on the input current to the PNP current mirror circuit 12. With Q4 added, the total base current loading $I_{E4}$ of the string of current mirror devices Q1 through Qn is reduced by the ratio of the emitter current to base current of Q4 which in this case is $\beta_4+1$. Thus, with very low betas as in the case of the lateral PNP transistors as mentioned above, the loading effect on the input current $I_2$ is still significant. Therefore, the transistor Q5 and the second current mirror circuit 14 is added to cancel the error introduced into the first current mirror circuit 12 as a result of the loading effect of the transistor Q4. The transistor Q5 should be identical to the transistor Q4 so that the base current loading of the transistor Q5, shown as $I_{B5}$, loads the input current $I_{IN}$ which is generated by the positive power supply through the resistor R1. More precisely, the transistor Q5 samples the collector current of the transistor Q4 which forms the emitter current for the transistor Q5. Thus, the base current $I_{B5}$ is almost equal to the base current $I_{B4}$ of the transistor Q4. The input current $I_1$ of the NPN second current mirror circuit 14 is equal to the sum of $I_{IN}$ and the base current $I_{E5}$ of transistor Q5. The second current mirror circuit 14 essentially changes the polarity of the input current so that the output current I2 contains a component equivalent to the current $I_{B5}$ which is opposite to the current value of $I_{B4}$, thus cancelling out the error introduced by the base current $I_{B4}$ of transistor Q4. This ultimately results in a reduction in base current error by another factor of $\beta+1$. The analytical analysis for deriving the improvement in operation by a factor of $\beta+1$ is as follows:

$$I_o = I_{C1} \tag{7}$$

$$I_{E4} = NI_o/\beta; \text{ where } (\beta_1=\beta_2=\beta_3=\beta_4) \text{ and } (\beta_4=\beta_5) \tag{8}$$

$$I_{E5} = I_{E4}(\beta_4/(\beta_4+1)) \tag{9}$$

$$I_{B4} = I_{E4}(1/(\beta_4+1)) \tag{10}$$

$$I_{B5} = I_{E5}(1/\beta_4+1) = (\beta_4/(\beta_4+1))\cdot(1/(\beta_4+1))\cdot I_{E4} \tag{11}$$

$$I_{IN} = I_1 - I_{B5} = I_1 - (\beta_4/(\beta_4+1))\cdot(1/(\beta_4+1))\cdot NI_o/\beta_1 \tag{12}$$

$$I_2 = I_1 = I_o + (1/(\beta_4+1))\cdot NI_o/(\beta_1) \tag{13}$$

$$I_{IN} = I_o + (1/(\beta_4+1))\cdot NI_o/\beta_1 - (\beta_4/(\beta_4+1))\cdot(1/(\beta_4+1))\cdot NI_o/\beta_1 \tag{14}$$

$$I_{IN} = I_o(1 + N/(\beta_4+1)(\beta_4+1)) \tag{15}$$

If the transistor Q5 and second current mirror circuit 14 were eliminated from FIG. 3, the remainder of the circuit would be similar to the circuit of FIG. 2 and the relationship between the input current and output current would be:

$$I_o/I_{IN} = 1/(1 + N/(\beta_1(\beta_4+1))) \tag{16}$$

Thus, comparing equation (16) to equation (15) the base current error has been reduced by a factor of $\beta_4+1$ using the circuit of FIG. 3.

In summary, the second current mirror circuit 14 combines the input current $I_{IN}$ with the base current $I_{B5}$ of the transistor Q5 and feeds the combined current back into the collector of the transistor Q1 to reduce the base current error caused by the base current from the base of the transistor Q4.

FIG. 4 graphically illustrates the improvement in the ratio of output current to the input current ($I_o/I_{IN}$) using the circuit of FIG. 3, represented by the curve 40, over the circuit of FIG. 2, represented by the curve 42, as Beta is varied from 0.5 to 5.0 when only two transistors are used in the first current mirror circuit 12.

FIG. 5 graphically illustrates the improvement in the ratio of output current to the input current ($I_o/I_{IN}$) using the circuit of FIG. 3, represented by the curve 50, over the circuit of FIG. 2, represented by the curve 52, when eight transistors are used in the first current mirror circuit 12, as Beta is again varied from 0.5 to 5.0.

Obviously, numerous (additional) modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A current mirror circuit, comprising:
   first current mirror circuit means having an input and an output, for generating a bias current;
   first error correction circuit means, connected to said first current mirror circuit, for generating a first correction signal directed only to the input of said current mirror circuit; and
   second error correction circuit means, connected to said first error correction circuit means and the input of said first current mirror circuit means, for generating a second correction signal directed only to the input of said current mirror circuit, whereby the current error caused by said first error correction circuit means is reduced.

2. A current mirror circuit, according to claim 1, wherein said first current mirror circuit means comprises:
   a first plurality of transistors including first and second transistors, connected to form a first current mirror circuit.

3. A current mirror circuit, according to claim 2, wherein said first error correction circuit means, comprises:
   a first error correction transistor, connected to said first and second transistors, for feeding current back into said first transistor.

4. A current mirror circuit, according to claim 3, wherein said second error correction circuit means comprises:
   a second error correction transistor, connected to said first error correction circuit; and
   a second plurality of transistors connected to form a second current mirror circuit connected to said second error correction transistor and said first current mirror circuit.

5. A current mirror circuit, comprising:
   a first plurality of transistors including at least first and second transistors, connected together to form a first current mirror circuit, for generating an output signal from an input signal;
   a third transistor, having an emitter connected to the commonly connected bases of said first and second transistors of said first current mirror circuit and a base connected to the collector of said first transistor, for reducing the base current loading of said first current mirror;
   a fourth transistor, having an emitter connected to the collector of said third transistor, a collector connected to ground and a base, for generating a signal at said base which is substantially equal to the signal generated from the base of said third transistor;
   a second plurality of transistors including at least fifth and sixth transistors connected together to form a second current mirror circuit, for generating a correction signal for substantially cancelling the signal error caused by the base loading effect of said fourth transistor.

6. A current mirror circuit, according to claim 5, wherein:
   said first plurality of transistors are PNP transistors.

7. A current mirror circuit, according to claim 6, wherein:
   said second plurality of transistors are NPN transistors.

8. A current mirror circuit, according to claim 5, wherein:
   said third and fourth transistors have substantially equal current gains (betas).

9. A current mirror circuit, according to claim 8, wherein:
   said third transistor reduces the base current error of said first current mirror circuit by a factor of beta plus one ($\beta+1$); and
   said fourth transistor and second current mirror circuit further reduces the base current error of said first current mirror circuit by a factor of beta plus one ($\beta+1$).

* * * * *